United States Patent
Xu et al.

(10) Patent No.: US 7,011,716 B2
(45) Date of Patent: Mar. 14, 2006

(54) COMPOSITIONS AND METHODS FOR DRYING PATTERNED WAFERS DURING MANUFACTURE OF INTEGRATED CIRCUITRY PRODUCTS

(75) Inventors: Chongying Xu, New Milford, CT (US); Michael Korzenski, Danbury, CT (US); Thomas H. Baum, New Fairfield, CT (US); Alexander Borovik, West Hartford, CT (US); Eliodor G. Ghenciu, King of Prussia, PA (US)

(73) Assignee: Advanced Technology Materials, Inc., Danbury, CT (US)

(*) Notice: Subject to any disclaimer, the term of this patent is extended or adjusted under 35 U.S.C. 154(b) by 199 days.

(21) Appl. No.: 10/249,658

(22) Filed: Apr. 29, 2003

(65) Prior Publication Data
US 2004/0216772 A1     Nov. 4, 2004

(51) Int. Cl.
*B08B 3/08*      (2006.01)
*H01L 21/302*   (2006.01)
*B23G 1/34*      (2006.01)

(52) U.S. Cl. .............................. 134/34; 134/36; 134/2; 134/22.19; 252/194; 252/184; 252/364; 510/175; 510/407

(58) Field of Classification Search ............... 252/194, 252/184, 364; 134/22.19, 34, 36; 510/175, 510/407; 438/476, 477, 471, 734; 430/97, 430/125
See application file for complete search history.

(56) References Cited

U.S. PATENT DOCUMENTS

| | | | |
|---|---|---|---|
| 5,730,874 A * | 3/1998 | Wai et al. ................... 210/638 |
| 5,868,856 A * | 2/1999 | Douglas et al. ............... 134/2 |
| 5,868,862 A * | 2/1999 | Douglas et al. ............... 134/26 |
| 5,965,025 A * | 10/1999 | Wai et al. ................... 210/634 |
| 6,187,911 B1 * | 2/2001 | Wai et al. ................... 534/11 |
| 6,398,875 B1 * | 6/2002 | Cotte et al. ................... 134/2 |
| 6,558,475 B1 * | 5/2003 | Jur et al. ..................... 134/21 |
| 6,562,146 B1 * | 5/2003 | DeYoung et al. ............ 134/30 |
| 6,576,066 B1 * | 6/2003 | Namatsu ...................... 134/30 |
| 6,596,093 B1 * | 7/2003 | DeYoung et al. ............ 134/36 |
| 6,602,349 B1 * | 8/2003 | Chandra et al. .............. 134/19 |
| 6,602,351 B1 * | 8/2003 | DeYoung et al. ............ 134/36 |
| 6,684,525 B1 * | 2/2004 | DeSimone et al. .......... 34/329 |
| 6,764,552 B1 * | 7/2004 | Joyce et al. ................... 134/3 |
| 6,770,426 B1 * | 8/2004 | Vaartstra ...................... 430/331 |
| 6,804,900 B1 * | 10/2004 | Kawakami et al. ........... 34/351 |
| 6,858,089 B1 * | 2/2005 | Castrucci ....................... 134/2 |
| 2003/0047195 A1 * | 3/2003 | DeYoung et al. ............ 134/12 |
| 2003/0125225 A1 * | 7/2003 | Xu et al. ...................... 510/175 |
| 2004/0038532 A1 * | 2/2004 | Kawakami et al. ......... 438/689 |
| 2004/0072706 A1 * | 4/2004 | Arena-Foster et al. ...... 510/175 |
| 2004/0175948 A1 * | 9/2004 | DeSimone et al. ......... 438/690 |

* cited by examiner

*Primary Examiner*—Joseph D. Anthony
(74) *Attorney, Agent, or Firm*—Maggie Chappuis; Steven J. Hultquist; Tristan A. Fuierer

(57) ABSTRACT

Drying of patterned wafers is achieved in a manner effecting removal of water from the patterned wafers without collapse or deterioration of the pattern structures thereof. The drying is carried out in one aspect of the invention with a composition containing supercritical fluid, and at least one water-reactive agent that chemically reacts with water to form reaction product(s) more soluble in the supercritical fluid than water. Various methodologies are described for use of supercritical fluids to dry patterned wafers, which avoid the (low water solubility) deficiency of supercritical fluids such as supercritical $CO_2$.

21 Claims, 1 Drawing Sheet

COMPOSITIONS AND METHODS FOR DRYING PATTERNED WAFERS DURING MANUFACTURE OF INTEGRATED CIRCUITRY PRODUCTS

BACKGROUND OF INVENTION

The present invention relates to compositions and methodology for drying patterned wafers during the manufacture of integrated circuitry products.

BACKGROUND OF THE RELATED ART

During the manufacture of integrated circuit (IC) products, residual liquids such as water, alcohols, and the like must be completely removed from patterned wafers by drying operations. However, when critical dimensions are smaller than about 100 nanometers (nm), it is difficult to remove residual water from the patterned wafers with high aspect ratio trenches and vias without causing collapse of the lithographic pattern features.

For example, in the development of photo-exposed lithographic resists, patterned images are often dried with hexanes and nitrogen, or with isopropanol and nitrogen. These conventional drying methods do not work well for images having a critical dimension width <100 nm and aspect ratio greater than 1. At such feature dimensions, the surface tension of isopropanol or hexane pulls the images together, leading to collapse of the lithographic resist and loss of the patterned image, or to degradation of the polymeric resist.

The art therefore is in need of improved techniques for drying of patterned wafers which effect complete removal of water, alcohols, etc., without causing collapse of the pattern features or other adverse effects on the patterned wafers.

SUMMARY OF INVENTION

The present invention relates to compositions and methodology for drying of patterned wafers to remove water, alcohols, etc. from the wafer, without causing collapse of the pattern or other adverse effect on the wafer article.

In one aspect, the present invention relates to a composition for drying a patterned wafer to remove water therefrom, such composition comprising supercritical fluid, and at least one water-reactive agent that chemically reacts with water to form reaction product(s) more soluble in the supercritical fluid than water.

In a further aspect, the invention relates to a method of drying a patterned wafer to remove water therefrom, such method comprising contacting said patterned wafer with a composition comprising supercritical fluid, and at least one water-reactive agent that chemically reacts with water to form reaction product(s) more soluble in the supercritical fluid than water.

A still further aspect of the invention relates to a method of drying a patterned wafer to remove water therefrom, such method comprising contacting the patterned wafer with a first composition comprising liquid $CO_2$, and thereafter contacting the patterned substrate with a second composition comprising SCCO2, thereby effecting drying of the patterned substrate without damage to the pattern thereof.

Yet another aspect of the invention relates to a method of drying a patterned wafer to remove water therefrom, such method comprising (a) contacting the patterned wafer with a first composition comprising alcohol at pressure above about 1000 psi and temperature below 32° C., (b) contacting the patterned wafer with a second composition comprising an alcohol/$CO_2$ solution, and (c) contacting the patterned substrate with a third composition comprising SCCO2, thereby effecting drying of the patterned substrate without damage to the pattern thereof.

Other aspects, features and embodiments of the invention will be more fully apparent from the ensuing disclosure and appended claims.

DETAILED DESCRIPTION

Figure 1:
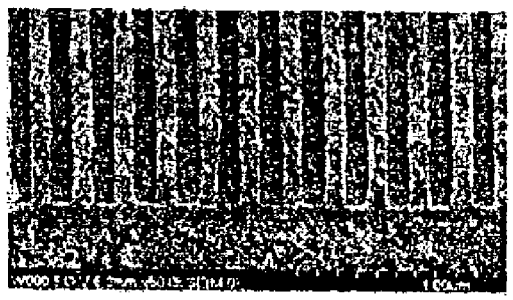
FIG. 1 is a scanning electron microscope (SEM) photograph of a patterned wafer showing the details of the pattern structure, utilized as a control sample, relative to FIGS. 2–4.

The present invention is based on the use of supercritical fluid (SCF) as a cleaning medium for drying of patterned wafers, in various approaches that avoid the problems incident to the use of supercritical fluids per se.

While supercritical fluids might on first consideration be regarded as potentially useful media for drying of patterned wafers, since supercritical fluids have high diffusivity, low viscosity, near-zero surface tension, and superior penetrating ability, supercritical fluids such as supercritical $CO_2$ (SCCO2) are non-polar and therefore are not useful for drying of patterned wafers. For example, the solubility of water in supercritical $CO_2$ is <0.1% by weight, making supercritical $CO_2$ unsuitable for removing residual water on the patterned wafer.

The present invention overcomes the problems incident to the use of supercritical fluids as drying media.

While the invention is hereinafter described with specific reference to $CO_2$ as an illustrative supercritical fluid species, it will be recognized that the utility of the invention is not thus limited, and that the supercritical fluid in the practice of the present invention can be of any suitable type. Supercritical fluids are formed under conditions at which the density of the liquid phase equals the density of the gaseous phase of the substance. For example, carbon dioxide ($CO_2$), which is a gas at standard temperature and pressure, undergoes a transition from liquid to SCF above a critical point, corresponding to $T_c \geq 31.1°$ C. and $p_c \geq 72.8$ atm. Once formed, the density of the SCF can be varied from liquid-like to gaseous-like, yielding different solvation abilities, by varying the pressure and temperature. Supercritical fluids have a density/solubility and diffusibility approaching that of the liquid and gaseous phase, respectively. Additionally, the surface tension of SCFs is negligible.

Because of its readily manufactured character, lack of toxicity and negligible environmental effects, supercritical $CO_2$ is a preferred SCF in the broad practice of the present invention, although the invention may be practiced with any suitable SCF species, with the choice of a particular SCF depending on the specific application involved. Other preferred SCF species useful in the practice of the invention include oxygen, argon, krypton, xenon, and ammonia.

In a first embodiment, supercritical fluids are used as drying media for patterned wafers in drying compositions that include one or more water-reactive agents that chemically react with water on the patterned wafer to form reaction product species that are more soluble in the supercritical fluid than water.

The product diol, $CF_3C(OH)_2CF_3$, is highly soluble in SCCO2 and is readily dissolved by the supercritical fluid, thereby effectively removing water from the patterned wafer substrate with which the supercritical fluid composition, comprising SCCO2 and HFA, is contacted.

More generally, the water-reactive agent in the supercritical fluid-based wafer drying composition can be of any suitable type, including for example, other halogenated aldehydes and ketones; halogenated diketones, e.g., 1,1,1,5,5,5-hexafluoro-2,4-pentanedione, alternatively denoted as (hfac)H; halogenated esters; carboxylic anhydrides, e.g., $(CH_3CO)_2O$; siloxanes, halogenated silanes; and any other compounds and materials that easily react with water and form derivatives soluble in supercritical $CO_2$ or other supercritical fluid species.

Generally, the water-reactive agent can be formulated in the supercritical fluid composition at any suitable concentration that is effective for water removal from the patterned wafer substrate. In various embodiments, depending on the particular supercritical fluid species employed, the concentration of the water-reactive agent can be a concentration in a range of from about 0.01 to about 10.0% by weight, based on the total weight of the supercritical fluid and the water-reactive agent, with concentrations of from about 0.1 to about 7.5% by weight, on the same total weight basis being more preferred, and from about 0.1 to about 5.0% by weight, on the same total weight basis being most preferred.

The supercritical fluid drying composition in addition to the supercritical fluid and the water-reactive agent, can contain other components, e.g., co-solvent(s) for removal of components other than water from the patterned substrate, active agent(s) other than the water-reactive agent, surfactant(s), chelating agent(s), etc., as necessary or desirable in a given application of the drying composition.

As used in such context, an "active agent" is a material that induces chemical reaction and/or physical enhancement of solubility, either in the cleaning composition, or at the surface of the patterned substrate structure, to enhance the cleaning and/or removal action of the composition, relative to a corresponding composition lacking such material.

Illustrative co-solvent species can include, but are not limited to, xylene, methanol, ethanol, and higher alcohols, N-alkylpyrrolidiones, such as N-methyl-, N-octyl-, or N-phenyl-pyrrolidones, dimethylsulfoxide, sulfolane, catechol, ethyl lactate, acetone, methyl ethyl ketone, butyl carbitol, monoethanolamine, butyrol lactone, diglycol amine, alkyl ammonium fluoride Γ-butyrolactone butylene carbonate, ethylene carbonate, propylene carbonate, etc.

The co-solvent species may be a single component co-solvent or two or more solvent components. The co-solvent may be present in the supercritical fluid-based drying composition at any suitable concentration, consistent with solubility of the co-solvent in the supercritical fluid.

Examples of active agents include, without limitation, acids, bases, reducing agents, and oxidizing agents. When a reducing agent is solubilized in the supercritical fluid, the reducing agent may require activation, e.g., by an activation process involving thermal, optical, and/or sonic activation.

Surfactants useful in the drying compositions of the present invention may likewise be of any suitable type, including anionic, neutral cationic, and zwitterionic types. Illustrative surfactant species include, without limitation, acetylenic alcohols and diols, and long alkyl chain secondary and tertiary amines.

Chelating agents useful in the drying compositions of the invention may be of any suitable type including, for example, polycarboxylic acids such as iminodiacetic acid and lauryl ethylenediamine triacetic acid, β-diketones such as: 2,4-pentanedione; 1,1,1-trifluoro-2,4-pentandione; and 1,1,1,5,5,5-hexafluoro-2,4-pentanedion, substituted dithiocharbanates, malonic acid esters, and polyethylene glycols.

Illustrative species of acids useful in drying compositions of the invention include, without limitation, perfluorocarboxyic acids, and alkyl or aryl sulfonic acids. Illustrative species of bases useful in drying compositions of the invention include, but are not limited to, amines, such as alkyl amines. Oxidizing agents useful in the broad practice of the invention include, without limitation, oxygen, ozone and nitrous oxide. Reducing agents usefully employed in the drying compositions of the invention include, without limitation, hydrogen, ammonia, xylenes, hydrides, silane, alkylsilanes, hydrazine hydrate or alkyl hydrazine.

Various compositions can be employed within the scope of the present invention, and such compositions can alternatively comprise, consist or consist essentially of specific identified component(s) described herein, as desired in a given application of the invention.

The contacting of the patterned substrate with the drying composition is carried out for a suitable period of time, which in a specific embodiment can for example be on the order of from about 20 to about 60 seconds, although other (longer or shorter) periods of contacting may be usefully employed depending on the nature and amount of the water to be removed from the patterned substrate, and the process conditions employed for drying.

Following drying of the patterned substrate, the contacting vessel in which the supercritical fluid-based composition is contacted with the patterned substrate can be rapidly decompressed to separate the supercritical fluid composition from the patterned substrate and exhaust the regasified supercritical fluid from the contacting vessel, so that the non-supercritical component(s), such as the soluble water reaction product(s), can be entrained in the regasified supercritical fluid and likewise be removed from the drying locus.

Such decompression step may be conducted for a suitable period of time, e.g., on the order of 10–40 seconds, although longer or shorter times may be desirable depending on the character of the material to be removed from the patterned substrate and the specifics of the process. If necessary, repeated cycles of contacting and decompression may be utilized, to achieve substantially complete removal of the water from the patterned substrate article.

The above-described composition and method can be usefully employed to clean residual water from small dimensions on semiconductor substrates subsequent to photolithographic image patterning processes without the occurrence of pattern collapse.

In another aspect, the present invention contemplates use of supercritical fluid-based drying compositions as part of a two-step process for obtaining efficient drying without the collapse of the pattern features. In this drying process, an initial drying step is carried out by contacting the patterned substrate with liquid $CO_2$, followed by a second drying step including contacting the patterned substrate with SCCO2, to achieve drying of the patterned substrate without accompanying damage to the patterned wafer.

In this two-step drying process, the liquid phase $CO_2$ in the first step has a higher density than SCCO2, so that it can solvate water and/or alcohol on the patterned substrate, but such contacting alone is not sufficient to complete the drying of the patterned substrate, and therefore the second step of rinsing the patterned substrate is employed to effect complete removal of the water and/or alcohol on the substrate.

The advantages of the two-step drying process described above were demonstrated using patterned wafers of the type shown in FIG. 1

Figure 2:
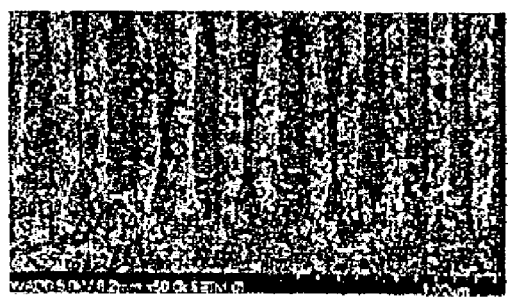
FIG. 2 is an SEM photograph of a patterned wafer of the type shown in FIG. 1, after air-drying of the wafer.
Figure 3:
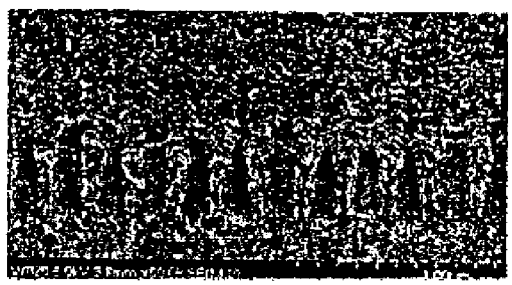
FIG. 3 is an SEM photograph of a patterned wafer of the type shown in FIG. 1, after drying of the wafer with liquid $CO_2$.
Figure 4:
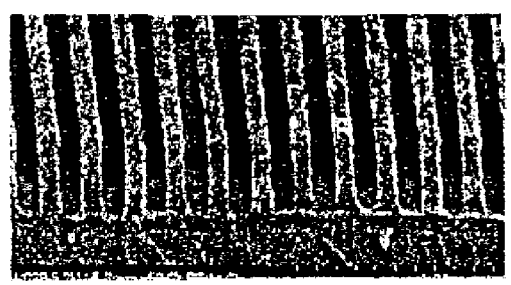
FIG. 4 is an SEM photograph of a patterned wafer of the type shown in FIG. 1, after drying of the wafer, first with liquid $CO_2$ and then with supercritical $CO_2$.

FIG. 1 is a scanning electron microscope (SEM) photograph of a patterned wafer showing the details of the pattern structure, utilized as a control sample, relative to FIGS. 2–4.

In the drying tests, the test wafers were immersed in water and then in pure alcohol for several minutes each, and the wafers were then placed in the cleaning chamber for drying.

A first test wafer was air-dried. FIG. 2 is an SEM photograph of a patterned wafer of the type shown in FIG. 1, after such air-drying of the wafer. As shown in FIG. 2, the water and alcohol were not completely removed, and the residual amounts of these contaminants caused collapsing of the pattern structure to occur.

A second test wafer was dried with liquid $CO_2$. FIG. 3 is an SEM photograph of a patterned wafer of the type shown in FIG. 1, after such drying of the wafer with liquid $CO_2$. As shown in FIG. 3, the water and alcohol were not completely removed, and the residual amounts of these contaminants caused a high level of collapse of the pattern structure to take place.

A third test wafer was dried in a two-step process as described hereinabove, including a first step of contacting the patterned wafer with liquid $CO_2$ and a second step of contacting the patterned wafer, after the first contacting step, with supercritical $CO_2$. FIG. 4 is an SEM photograph of a patterned wafer of the type shown in FIG. 1, after such drying of the wafer, first with liquid $CO_2$ and then with supercritical $CO_2$. The pattern structure of the wafer was not altered by this two-step drying operation, and the pattern was retained in a manner consistent with the control wafer (compare FIGS. 1 and 4).

The two-step process described above can be carried out at any suitable process conditions and for any suitable durations in the respective first and second steps. In one embodiment, the first liquid $CO_2$ contacting step can be carried out at temperature in a range of from about 20° C. to about 30° C. for a time in a range of from about 0.5 to about 20 minutes, and the second SCCO2 contacting step can be carried out at temperature in a range of from about 32° C. to about 75° C. for a duration in a range of from about 0.5 to about 20 minutes.

In yet another aspect, the present invention contemplates use of supercritical fluid-based drying compositions as part of a three-step process for obtaining efficient drying without the collapse of the pattern features.

In this drying process, an initial drying step is carried out in which the patterned substrate is contacted with alcohol at a pressure above about 1000 psi and temperature below the critical temperature of $CO_2$, 32° C., for a suitable period of time, e.g. from about 1 minute to about 15 minutes. The alcohol can be a single component alcohol, or it can be a mixture of alcohol species, and the alcohol can be recirculated in contact with the patterned substrate, or it can be contacted in a batch or a semibatch mode.

The second step is carried out after the alcohol contacting step, and involves contacting the patterned substrate with an alcohol/$CO_2$ solution to remove alcohol from the first contacting step. This second step preferably is carried out with recirculation of the alcohol/$CO_2$ solution through the contacting chamber containing the patterned substrate, although the contacting may be carried out in a single-pass manner, or in a batch or semi-batch mode of operation. The second step contacting can be carried out at a temperature in a range of from about 22° C. to about 31° C. for a duration in a range of from about 0.5 to about 20 minutes. As in the first step, the alcohol can be a single component alcohol, or it can be a mixture of alcohol species.

The alcohol utilized in the first and second contacting steps can be the same as or different from each other. The alcohol can be of any suitable type. In one embodiment of the invention, such alcohol comprises a $C_1$–$C_4$ alcohol (i.e., methanol, ethanol, propanol, or butanol), or a mixture of two or more such alcohol species.

The third step is carried out after the alcohol/$CO_2$ solution contacting step, and involves rinsing the patterned substrate with SCCO2. Such supercritical fluid rinse step can be carried out at a temperature in a range of from about 32° C. to about 75° C. and pressure in a range of from about 80 to about 300 atm., for a duration in a range of from about 0.5 to about 30 minutes. Each of the first, second and third steps can be carried out in a same process vessel, suitably valved, piped and manifolded for delivery, and, if desired, recirculation, of the successive drying compositions.

The alcohol/$CO_2$ solution can be formulated with the alcohol at any suitable concentration. In one embodiment, the concentration of the alcohol in the alcohol/$CO_2$ solution is from about 1 to about 15% by weight, based on the total weight of the alcohol and $CO_2$ components in the alcohol/$CO_2$ solution. The alcohol/$CO_2$ solution can also be formulated with other components as desired, such as those (e.g., co-solvents, active agent(s), surfactant(s) and/or chelating agent(s)) illustratively described hereinabove.

Although the invention has been described herein with reference to various specific aspects, features and embodiments, it will be appreciated that the invention is not thus limited, but rather extends to and encompasses other variations, modifications and embodiments, such as will suggest themselves to those of ordinary skill in the art, based on the disclosure herein. Accordingly, the invention is intended to be broadly interpreted and construed, as including all such other variations, modifications and embodiments, within the spirit and scope of the invention as hereinafter claimed.

What is claimed is:

1. A method for drying a patterned wafer to remove water therefrom, said method comprising contacting said patterned wafer with a composition comprising supercritical fluid, and at least one water-reactive agent that chemically reacts with water to form reaction product(s) more soluble in the supercritical fluid than water, wherein said at least one water-reactive agent comprises hexafluoroacetone.

2. The method of claim 1, wherein said supercritical fluid comprises a supercritical fluid species selected from the group consisting of carbon dioxide, oxygen, argon, krypton, xenon, and ammonia.

3. The composition of claim 1, wherein said supercritical fluid comprises carbon dioxide.

4. The method of claim 1, further comprising at least one additional water-reactive agent selected from the group consisting of: halogenated aldehydes and ketones; halogenated diketones; halogenated esters; carboxylic anhydrides; siloxanes; and halogenated silanes.

5. The method of claim 4, further comprising at least one additional water-reactive agent comprises an agent selected from the group consisting of: $(CH_3CO)_2O$; and 1,1,1,5,5,5-hexafluoro-2,4-pentanedione.

6. The method of claim 1, wherein said at least one water-reactive agent is at a concentration in a range of from aboutn 0.01 to about 10.0% by weight, based on the total weight of the supercritical fluid and the water-reactive agent.

7. The method of claim 1, further comprising at least additional component selected from the group consisting of co-solvents, surfactants, chelating agents, acids, bases, reducing agents and oxidizing agents.

8. The method of claim 1, wherein said contacting is carried out for a period of from about 20 to about 60 seconds.

9. The method of claim 1, wherein said contacting is carried out in a contacting zone to which said composition is introduced.

10. The method of claim 9, wherein the composition is flowed through said contacting zone.

11. The method of claim 10, wherein the composition is recirculated through said contacting zone.

12. The method of claim 9, wherein after a predetermined period of contacting, the contacting zone is depressurized to exhaust the composition therefrom.

13. The method of claim 12, wherein the contacting zone is depressurized for a period of time in a range of from about 10 to about 40 seconds to exhaust the composition and removed water from the contacting zone.

14. The method of claim 1, wherein the contacting is carried out without collapse of the pattern of the patterned wafer.

15. A composition for drying a patterned wafer to remove water therefrom, said composition comprising a supercritical fluid, and at least one wafer-reactive agent that chemically reacts with water to form reaction product(s) that is more soluble in the supercritical fluid than water, wherein said at least one water-reactive agent comprises hexafluoroacetone.

16. The composition of claim 15, wherein said supercritical fluid comprises a supercritical fluid species selected from the group consisting of carbon dioxide, oxygen, argon, krypton, xenon, and ammonia.

17. The composition of claim 15, wherein said supercritical fluid comprises carbon dioxide.

18. The composition of claim 15, further comprising at least one additional water-reactive agent selected from the group consisting of: halogenated aldehydes and ketones; halogenated diketones; halogenated esters; carboxylic anhydrides; siloxanes; and halogenated silanes.

19. The composition of claim 18, wherein said at least one additional water-reactive agent selected from the group consisting of: $(CH_3CO)_2O$; and 1,1,1,5,5,5-hexafluoro-2,4-pentanedione.

20. The composition of claim 15, wherein said at least one water-reactive agent is at a concentration in a range of from about 0.01 to about 10% by weight, based on the total weight of the supercritical fluid and the water-reactive agent.

21. The composition of claim 15, further comprising at least one additional component selected from the group consisting of co-solvents, surfactants, chelating agents, acids, bases, reducing agents and oxidizing agents.

* * * * *

UNITED STATES PATENT AND TRADEMARK OFFICE
CERTIFICATE OF CORRECTION

PATENT NO. : 7,011,716 B2
APPLICATION NO. : 10/249658
DATED : April 18, 2006
INVENTOR(S) : Chongying Xu et al.

It is certified that error appears in the above-identified patent and that said Letters Patent is hereby corrected as shown below:

Face of Patent, Item (75): please delete "Eliodor G. Ghenciu, King of Prussia, PA (US)"

Column 6, line 44, "for" should be --of--

Column 6, line 62, "further comprising" should be --wherein said--

Column 7, line 3 and 4, "at least additional" should be --at least one additional--

Column 7, line 28, delete "a"

Column 8, line 17, "water-reactive agent" should be --water-reactive agent comprises an agent--

Signed and Sealed this

Tenth Day of October, 2006

JON W. DUDAS
*Director of the United States Patent and Trademark Office*

UNITED STATES PATENT AND TRADEMARK OFFICE
CERTIFICATE OF CORRECTION

PATENT NO.         : 7,011,716 B2
APPLICATION NO. : 10/249658
DATED              : March 14, 2006
INVENTOR(S)        : Chongying Xu et al.

It is certified that error appears in the above-identified patent and that said Letters Patent is hereby corrected as shown below:

Face of Patent, Item (75): please delete "Eliodor G. Ghenciu, King of Prussia, PA (US)"

Column 6, line 44, "for" should be --of--

Column 6, line 62, "further comprising" should be --wherein said--

Column 7, line 3 and 4, "at least additional" should be --at least one additional--

Column 7, line 28, delete "a"

Column 8, line 17, "water-reactive agent" should be --water-reactive agent comprises an agent--

This certificate supersedes Certificate of Correction issued October 10, 2006.

Signed and Sealed this

Fourteenth Day of November, 2006

JON W. DUDAS
*Director of the United States Patent and Trademark Office*

UNITED STATES PATENT AND TRADEMARK OFFICE
CERTIFICATE OF CORRECTION

PATENT NO. : 7,011,716 B2  
APPLICATION NO. : 10/249658  
DATED : March 14, 2006  
INVENTOR(S) : Chongying Xu et al.

Page 1 of 1

It is certified that error appears in the above-identified patent and that said Letters Patent is hereby corrected as shown below:

Column 6, line 55, "composition" should be --method--

Signed and Sealed this

Sixth Day of March, 2007

JON W. DUDAS  
*Director of the United States Patent and Trademark Office*